(12) United States Patent
Yamamoto et al.

(10) Patent No.: US 8,071,187 B2
(45) Date of Patent: Dec. 6, 2011

(54) METHOD FOR FABRICATING METALLIZED CERAMICS SUBSTRATE, METALLIZED CERAMICS SUBSTRATE FABRICATED BY THE METHOD, AND PACKAGE

(75) Inventors: Yasuyuki Yamamoto, Yamaguchi (JP);
Osamu Yatabe, Yamaguchi (JP);
Masakatsu Maeda, Yamaguchi (JP)

(73) Assignee: Tokuyama Corporation, Yamaguchi (JP)

( * ) Notice: Subject to any disclaimer, the term of this patent is extended or adjusted under 35 U.S.C. 154(b) by 339 days.

(21) Appl. No.: 12/161,193

(22) PCT Filed: Jan. 23, 2007

(86) PCT No.: PCT/JP2007/050940
§ 371 (c)(1),
(2), (4) Date: Jul. 17, 2008

(87) PCT Pub. No.: WO2007/088748
PCT Pub. Date: Aug. 9, 2007

(65) Prior Publication Data
US 2010/0178461 A1    Jul. 15, 2010

(30) Foreign Application Priority Data

Jan. 31, 2006 (JP) ................. 2006-023274

(51) Int. Cl.
*B29D 22/00* (2006.01)
*B32B 7/02* (2006.01)
*H01L 23/15* (2006.01)
*H05K 5/06* (2006.01)
*H05K 7/02* (2006.01)

(52) U.S. Cl. ....... 428/34.4; 428/209; 428/210; 428/212; 428/409; 361/730; 361/752; 361/811; 361/820; 257/676; 257/703; 257/704

(58) Field of Classification Search ............. 428/141, 428/172, 209, 210, 212, 34.4, 68, 409; 438/15, 438/25, 26, 123, 124; 361/730, 752, 811, 361/820; 257/99, 676, 703, 704
See application file for complete search history.

(56) References Cited

U.S. PATENT DOCUMENTS
3,922,400 A   11/1975   Kawanobe et al.
3,978,248 A   8/1976    Usami
(Continued)

FOREIGN PATENT DOCUMENTS
EP   0 330 848 A1   9/1989
(Continued)

OTHER PUBLICATIONS
European Search Report PCT/JP2007050940.
(Continued)

*Primary Examiner* — Donald J Loney
(74) *Attorney, Agent, or Firm* — Ladas & Parry LLP

(57) ABSTRACT

A fabrication method for metallized a ceramics substrate including the steps of: forming a first conductive paste layer containing metallic powder on a sintered ceramics substrate; forming a second conductive paste layer containing metallic powder of which average particle diameter is different from that of metallic powder constituting the first conductive paste layer; and forming a first conductive layer and a second conductive paste layer. The surface roughness of the first conductive layer and the second conductive layer is different. By this method, it is possible to secure airtightness of the metallized ceramics substrate even if it is a multilayered substrate having a plurality of metallized layers.

6 Claims, 2 Drawing Sheets

U.S. PATENT DOCUMENTS

| | | | |
|---|---|---|---|
| 4,827,082 A | 5/1989 | Horiuchi et al. | |
| 6,204,454 B1 * | 3/2001 | Gotoh et al. | 174/255 |
| 6,596,384 B1 * | 7/2003 | Day et al. | 428/212 |
| 2002/0175397 A1 | 11/2002 | Hosoi et al. | |

FOREIGN PATENT DOCUMENTS

| | | |
|---|---|---|
| JP | 63-86598 | 4/1988 |
| JP | 04-354177 | 12/1992 |
| JP | 06-196831 | 7/1994 |
| JP | 06-291435 A | 10/1994 |
| JP | 08-239286 | 9/1996 |
| JP | 09-246694 A | 9/1997 |
| JP | 2003-283110 | 10/2003 |

OTHER PUBLICATIONS

International Search Report: PCT/JP2007/050940.

* cited by examiner

US 8,071,187 B2

METHOD FOR FABRICATING METALLIZED CERAMICS SUBSTRATE, METALLIZED CERAMICS SUBSTRATE FABRICATED BY THE METHOD, AND PACKAGE

TECHNICAL FIELD

The present invention relates to a fabrication method for a metallized ceramics substrate, a metallized ceramics substrate fabricated by the method, and a package including the metallized ceramics substrate.

BACKGROUND ART

Conventionally, as fabrication methods of a metallized ceramics substrate, co-firing method and post-firing method have been commonly known. Co-firing method means a method for fabricating a metallized ceramics substrate precursor by forming a conductive paste layer on a non-fired ceramics substrate precursor, the so-called "green sheet" and firing this thereafter. In this method, firing of the green sheet and the conductive paste layer is done simultaneously. Post-firing method, on the other hand, means a method for fabricating a metallized ceramics substrate precursor by forming a conductive paste layer on a sintered ceramics substrate obtained by firing a green sheet, and firing this thereafter. In this method, firing the green sheet and conductive paste layer is sequentially done. Various fabrication methods of a metallized ceramics substrate using post-firing method are known, one of the examples is disclosed in Patent document 1.

Both of the above methods are capable to make wiring on the ceramics substrate; the obtained substrate is mainly used as a substrate for mounting semiconductor device. Such a substrate on which semiconductor devices are mounted is required to improve the accuracy and fineness of a wiring pattern with the miniaturization of parts to be mounted.

When wiring pattern is formed by co-firing method, the green sheet tends to unevenly shrink at a time of firing. For example, if a square green sheet is sintered, slight shrinkage is caused such that center portion of each side of the square inwardly warps and the square shape is deformed into a star-like one. So, if many wiring patterns with the same shape are formed on one green sheet, inevitably, the shape of patterns is slightly changed depending on the area where patterns are formed.

Meanwhile, in case of forming wiring pattern by post-firing method, the wiring pattern is formed by directly applying a conductive paste on a sintered ceramics substrate and drying thereof, then firing the paste after drying. When firing the wiring, conductive paste layer shrinks in a thickness direction but it does hardly shrink in a planar direction, problems like shape of pattern is changed depending on the area to be formed as seen from co-firing method cannot be caused.
Patent Document 1: Japanese Patent Application Laid-Open (JP-A) No. 8-239286

DISCLOSURE OF THE INVENTION

Problems to be Solved by the Invention

A metallized ceramics substrate is formed to become an electronic component like light-emitting element by mounting, e.g., LD elements or LED elements at semiconductor-device mounting-portions on a substrate and sealing the upper portion with a lid such as lens. If the substrate is required to offer long-time reliability, it is necessary to completely shut off outside of the electronic component from inside of the same for protection of the elements mounted in the component. Because of this, the metallized ceramics substrate is required to have airtightness.

As a metallized ceramics substrate, a multilayered substrate, which comprises: a metallized layer which works as an electrode on which elements are mounted; and a metallized layer for soldering lens and so on at the upper portion of the substrate, wherein a sintered ceramics layer is formed between the two layers and insulate one metallized layer from another one, is fabricated.

However, as mentioned above, in view of improvement of accuracy and fineness of the wiring pattern, when the above multilayered substrate is fabricated by using post-firing method as a preferable method, the method cannot secure airtightness of the metallized ceramics substrate.

Accordingly, an object of the present invention is to provide a metallized ceramics substrate which is possible to secure airtightness even if it is a multilayered substrate having a plurality of metallized layers, to solve the problems.

Means for Solving the Problems

Hereinafter, the invention will be described. In order to make the understanding to the present invention easier, reference numerals of the attached drawings are quoted in brackets; however, the present invention is not limited by the embodiment shown in the drawings.

The first aspect of the invention is a fabrication method for metallized ceramics substrate comprising the steps of: forming a first conductive paste layer containing metallic powder on a sintered ceramics substrate (10) of which surface may have a ceramics paste layer; forming a second conductive paste layer containing metallic powder of which average particle diameter is different from that of metallic powder constituting the first conductive paste layer; and forming a first conductive layer and a second conductive layer by firing the first conductive paste layer and the second conductive paste layer, wherein surface roughness of the first conductive layer and the second conductive layer is different.

Since the metallized ceramics substrate manufactured by the first aspect of the present invention has conductive layers of different surface roughness, one conductive layer of which surface roughness is smaller may be used for an electrode for mounting elements; meanwhile, the other conductive layer of which surface roughness is larger may be used for e.g. soldering lid member such as lens; this metallized ceramics substrate can be used depending on the purpose.

The second aspect of the invention is a fabrication method for a metallized ceramics substrate (200) comprising the steps of: forming a first conductive paste layer (20) containing metallic powder on a sintered ceramics substrate (10) of which surface may have a ceramics paste layer; forming a ceramics paste layer (30) on the first conductive paste layer (20); forming, on the ceramics paste layer (30), a second conductive paste layer (40) containing metallic powder of which average particle diameter is larger than that of metallic powder constituting the first conductive paste layer (20); and forming a first conductive layer (22), a sintered ceramics layer (32), and a second conductive layer (42) by firing the first conductive paste layer (20), the ceramics paste layer (30), and the second conductive paste layer (40), wherein surface roughness of the second conductive layer (42) is larger than that of the first conductive layer (22).

According to the second aspect of the invention, when a plurality of the metallized layers is formed on the sintered ceramics substrate (10), in other words, when a multilayered substrate having a plurality of the metallized layers is fabricated by post-firing method, if the first conductive paste layer (20) is configured with metallic powder having smaller particle diameter and the second conductive paste layer (40) is configured with metallic powder having larger particle diameter, it is possible to fabricate a metallized ceramics substrate (200) which exhibits excellent airtightness.

In the second aspect of the invention, average particle diameter of metallic powder constituting the first conductive paste layer (20) is preferably 0.1 µm or more and less than 3 µm; and average particle diameter of metallic powder constituting the second conductive paste layer (40) is preferably 3 µm or more and 6 µm or less. By using conductive paste layers having such average particle diameters, it is capable to set surface roughness of the first conductive layer (22) to be less than 1 µm, preferably 0.85 µm or less. Moreover, it is possible to set surface roughness of the second conductive layer (42) to be 1 µm or more, preferably 1.05 µm or more. Accordingly, it is possible to make a layer having favorable surface smoothness suitable for mounting a semiconductor device on the first conductive layer (22), but also possible to enhance airtightness of the metallized ceramics substrate (200).

In the first and second aspects of the invention, ceramics constituting the sintered ceramics substrate (10) is preferably aluminum nitride. Aluminum nitride has a high thermal conductivity; so, if the sintered ceramics (10) is configured with aluminum nitride, it is possible to fabricate a metallized ceramics substrate (200) which exhibits excellent heat dissipation property. In addition, though it is not shown by the drawings, a ceramics paste layer may be formed on the surface of sintered ceramics substrate (10), particularly surface of the side where the first conductive paste layer (20) is formed. By forming such a ceramics paste layer, when the first conductive paste layer (20) is formed by printing method, bleed of the paste can be reduced and finely-patterned conductive paste layer can be formed; but also, it is capable to enhance adhesiveness of the eventually formed first conductive layer (22). As it is possible to easily obtain these effects, ceramics constituting the above ceramics paste layer is preferably made of the same kind of ceramics constituting the sintered ceramics substrate (10). Thickness of the above ceramics paste layer, from the viewpoint of excellent dimensional stability given by the post-firing method, it is preferably 1 to 30 µm, particularly preferably 5 to 20 µm.

In the second aspect of the invention, ceramics constituting the sintered ceramics substrate and the ceramics paste layer (30) is preferably aluminum nitride. That is, if a ceramics is the one in which component constituting the ceramics substrate and ceramics paste layer is different, due to the difference of coefficient of thermal expansion and so on, there is a possibility of influence on warp and airtightness. Further, forming the sintered ceramics layer (32) obtained by sintering the ceramics substrate (10) and ceramics paste layer (30) with aluminum nitride makes it possible to fabricate a metallized ceramics substrate (200), which can exhibit excellent heat dissipation property.

In the first and second aspects of the invention, metallic powder constituting the first conductive paste layer (20) and the second conductive paste layer (40) is preferably high-melting point metals. In view of adhesiveness, the metallic powder is more preferably tungsten and/or molybdenum; in view of electric conductivity, linear expansion coefficient, and cost, tungsten is most preferable. By using high-melting point metals, it is capable to impart, to the layers, heat resistance to high temperature at a time of firing.

The third aspect of the invention is a metallized ceramics substrate (200) comprising: a sintered ceramics substrate (10); a first conductive layer (22) formed on the sintered ceramics substrate (10) and of which surface roughness is less than 1 µm; a sintered ceramics layer (32) formed on the first conductive layer (22); and a second conductive layer (42) formed on the sintered ceramics layer (32) and of which surface roughness is 1 µm or more.

In the third aspect of the invention, if surface roughness of the first conductive layer (22) is set to be less than 1 µm, it is possible to make a conductive layer which is suitable for mounting a semiconductor device on the first conductive layer (22) and which has a favorable smoothness. Further, if second conductive layer (42) is formed as a conductive layer having larger surface roughness than that of first conductive layer (22), it is possible to obtain a metallized ceramics substrate (200) which exhibits excellent airtightness.

The fourth aspect of the invention is a package (300) comprising the metallized ceramics substrate described in the third aspect of the invention, wherein a semiconductor device mounting portion (50) is provided on the first conductive layer (22) as well as at a central portion of the substrate (200); and the sintered ceramics layer (32) and the second conductive layer (42) are configured to encircle the semiconductor device mounting portion (50) so as to form a concave portion (70) for housing a semiconductor device (60).

In the fourth aspect of the package (300) of the invention, the first conductive layer (22) is used as an electrode for mounting the semiconductor device (60) thereon and for soldering the lid member (80) to the second conductive layer (42). Consequently, the first conductive layer (22) can be a smooth electrode suitable for mounting the semiconductor device (60); moreover, since the package (300) of the present invention exhibits excellent airtightness, when the lid member (80) is soldered to form an electronic component, it is capable to completely shut out the semiconductor device (60) from the outside, thereby possible to keep airtightness.

BRIEF DESCRIPTION OF THE DRAWINGS

FIGS. 2(a), 2(c), and 2(e) are plan views showing products of each step, FIG. 2(b) is a side cross sectional view including A-A' line, FIG. 2(d) is a side cross sectional view including B-B' line, and FIG. 2(f) is a side cross sectional view including C-C' line.

Figure 1:
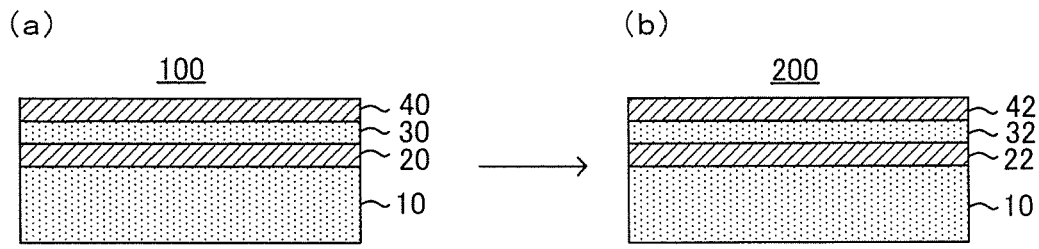
FIG. 1(a) is a frame format illustrating a laminated constitution of a metallized ceramics substrate precursor 100 fabricated as an intermediate in the fabrication method of the present invention.
FIG. 1(b) is a frame format illustrating a laminated constitution of a metallized ceramics substrate 200 fabricated by firing this metallized ceramics substrate precursor 100.

DESCRIPTION OF THE REFERENCE NUMERALS 10 sintered ceramics substrate
20, 20a, 20b first conductive paste layer
30 ceramics paste layer
40 second conductive paste layer
22 first conductive layer
32 sintered ceramics layer
42 second conductive layer
50 semiconductor device mounting portion
60 semiconductor device 62 wire bonding
70 concave portion
80 lid member
82 metal part

BEST MODE FOR CARRYING OUT THE
INVENTION

Hereinafter, the present invention will be described in detail based on the embodiments shown in the drawings.

Fabrication Method of the First Embodiment

A fabrication method of a metallized ceramics substrate of a first embodiment of the present invention comprising the steps of: forming a first conductive paste layer containing metallic powder on a sintered ceramics substrate 10 of which surface may have a ceramics paste layer; forming a second conductive paste layer containing metallic powder of which average particle diameter is different from that of metallic powder constituting the first conductive paste layer; and forming a first conductive layer and a second conductive layer by firing the first conductive paste layer and the second conductive paste layer. According to the fabrication method, it is possible to fabricate a metallized ceramics substrate wherein surface roughness of the first conductive layer and the second conductive layer is different.

In the fabrication method of the first embodiment of the invention, what is adopted is a post-firing method, wherein a conductive paste is applied on a pre-fired ceramics substrate and the paste is fired together with the substrate. Conventionally, when the metallized ceramics substrate was fabricated by the post-firing method, conductive paste layer was formed on the sintered ceramics substrate using methods like printing. So, in view of workability of printing and so on, application of a plurality of conductive pastes comprising metallic powder of which average particle diameter in each conductive paste is different was not carried out. Therefore, as the fabrication method of the present invention forms conductive paste layers comprising metallic powder of which average particle diameter in each conductive paste is different, it is novel.

Moreover, in the metallized ceramics substrate fabricated by the method of the first embodiment of the invention, the first conductive paste layer formed on the sintered ceramics substrate is sintered to be the first conductive layer, and the second conductive paste layer is also sintered to be the second conductive layer. The first conductive paste layer and the second conductive paste layer respectively contain metallic powder having different average particle diameter so that surface roughness of the first conductive layer and the second conductive layer both formed by sintering respective layer becomes different.

In this way, since the metallized ceramics substrate fabricated by the method of the first embodiment has conductive layers of different surface roughness, the conductive layer having smaller surface roughness can be used as an electrode for mounting a semiconductor device, and another conductive layer having larger surface roughness can be used as a metal and so on for soldering lid member such as lens. Hence, these can be selectively used depending on the purpose.

Fabrication Method of the Second Embodiment

FIG. 1(a) is a frame format illustrating a laminated constitution of a metallized ceramics substrate precursor 100 fabricated as an intermediate in the pre-firing process of the fabrication method for metallized ceramics substrate of the second embodiment of the present invention. Also, FIG. 1(b) is a frame format illustrating a laminated constitution of a metallized ceramics substrate 200 fabricated by firing this metallized ceramics substrate precursor 100.

The fabrication method of the second embodiment of the invention comprising the steps of: forming a first conductive paste layer 20 containing metallic powder on a sintered ceramics substrate 10 of which surface may have a ceramics paste layer; forming a ceramics paste layer 30 on the first conductive paste layer 20; and forming, on the ceramics paste layer 30, a second conductive paste layer 40 containing metallic powder of which average particle diameter is larger than that of metallic powder constituting the first conductive paste layer, to fabricate the metallized ceramics substrate precursor 100.

Thereafter, by forming a first conductive layer 22, a sintered ceramics layer 32, and a second conductive layer 42 by firing the first conductive paste layer 20, the ceramics paste layer 30, and the second conductive paste layer 40, a metallized ceramics substrate 200 can be formed. Accordingly, it is capable to fabricate a metallized ceramics substrate 200 wherein surface roughness of the second conductive layer 42 is larger than that of the first conductive layer 22. The fabrication method of the second embodiment of the invention will be described as follows in order of steps.

(Forming Step for First Conductive Paste Layer 20)

A forming step for the first conductive paste layer 20 of the invention is carried out by applying the first conductive paste on the sintered ceramics substrate 10 of which surface may have a ceramics paste layer and by drying the paste layer as needed.

(Sintered Ceramics Substrate 10)

As a sintered ceramics substrate 10 used in the invention, a substrate made of commonly known ceramics may be used without any limitation.

Examples of ceramics as a constitutional material of the sintered ceramics substrate include: (i) oxide ceramics such as aluminum oxide ceramics, silicon oxide ceramics, calcium oxide ceramics, and magnesium oxide ceramics; (ii) nitride ceramics such as aluminum nitride ceramics, silicon nitride ceramics, and boron nitride ceramics; (iii) beryllium oxide, silicon carbide, mullite, borosilicate glass, and so on. Among them, (ii) nitride ceramics is preferable, specifically, aluminum nitride type ceramics is preferably used in view of high thermal conductivity.

As a sintered ceramics substrate 10 used for the invention, from the viewpoint of easiness of commercial availability and ease of forming a desired shape, it is preferable to use a sintered ceramics substrate wherein the average diameter of ceramics particles constituting the sintered ceramics substrate is 0.5 to 20 μm, more preferably 1 to 15 μm. Such a sintered ceramics substrate can be obtained by firing a green sheet including ceramic powder material of which average diameter is 0.1 to 15 μm, preferably 0.5 to 5 μm.

The green sheet may include sintering aides, organic binder, and so on. As sintering aides, any sintering aides commonly used depending on the kind of ceramic powder material can be used without limitation. Further, as an organic binder, polyvinyl butyral, ethyl celluloses and acrylic resins may be used; so as to make the formability of green sheet preferable, poly-n-buthyl methacrylate and polyvinyl butyral are particularly suitably used.

As a green sheet for obtaining the sintered ceramics substrate 10 of the invention, in view of heat conductance of the obtained sintered body, a green sheet for nitride ceramics formed by using nitride ceramics powder containing sintering aides as ceramics material powder, particularly a green sheet for aluminum nitride formed by using aluminum nitride powder containing sintering aides (e.g., yttrium oxide and calcium oxide) as material powder, is suitably used.

Shapes of the sintered ceramics substrate 10 to be used in the invention is not particularly limited to as long as it does have a surface capable to form the first conductive paste layer 20 and the ceramics paste layer 30 thereon; it may be a sheet body, a sheet body a part of which is cut or pierced, or a curved substrate. In addition, the sintered ceramics substrate 10 may have via holes (namely, through-holes filled with conductive material or conductive paste) or inner-layer wiring. Such a sintered ceramics substrate 10 can be easily fabricated by co-firing method using a green sheet having the above-mentioned configuration, and the like.

Size of the sintered ceramics substrate 10 is not particularly limited to; it is adequately determined depending on the purpose. For instance, if it is a substrate for mounting electronic component, thickness of the substrate may be generally 0.1 to 2 mm, preferably 0.2 to 1 mm.

On the surface of the sintered ceramics substrate 10 thus obtained, ceramics paste layer (base ceramics paste layer) may be preliminarily formed as needed. As described above, by forming these base ceramics paste layers, it is not only possible to easily form a finely-patterned first conductive paste layer 20 but also possible to make adhesiveness of the first conductive layer 22 eventually formed favorable. If these base ceramics paste layers are not formed, when thickening the ceramics paste layer 30 to laminate in a later step, for some reason, peeling between the sintered ceramics substrate 10 and the first conductive layer 22 is caused, and airtightness sometimes cannot be secured. On the other hand, by having intervention of the above base ceramics paste layer, this problem is hardly caused.

Formation of the base ceramics paste layer can be basically carried out in the same manner as that of below-described ceramics paste layer 30. It is with a proviso that insulation is not specifically required to the base ceramics paste layer. So, when coloring (in black, etc.) is required in a portion where the base paste layer is exposed, high-melting point metallic powder made of such as tungsten can be mixed. Thickness of the base ceramics paste layer is preferably 1 to 30 μm, specifically 5 to 20 μm.

(First Conductive Paste Layer 20)

As a first conductive paste for forming the first conductive paste layer 20, a commonly known conductive paste containing metallic powder, organic binder, organic solvent, dispersant, plasticizer, and etc. may be used without limitation. Also, in the first conductive paste, it is preferable to contain the same kind of ceramics powder as the one contained in the ceramics paste to form the above base ceramics paste layer and the same kind of ceramics powder as the one contained in the ceramics paste to form the below-described ceramics paste layer 30. If the first conductive paste contains the same kind of ceramics powder as the one contained in the ceramics pastes, it is possible to improve the adhesiveness between sintered first conductive layer 22 and the sintered ceramics substrate 10 and between the sintered first conductive layer 22 and the sintered ceramics layer 32.

Examples of metallic powder contained in the first conductive paste may be metallic powder such as tungsten, molybdenum, gold, silver, and copper; among these, powder of high-melting point metals having thermal resistance to high temperature at a time of firing is preferable. In view of adhesiveness, the metallic powder is preferably tungsten and/or molybdenum; in view of electric conductivity and cost, tungsten is the most preferable.

Average diameter of the metallic powder contained in the first conductive paste is preferably smaller than that of metallic powder contained in the second conductive paste. In the invention, as above, since a plurality of conductive paste layers 20, 40 formed on the sintered ceramics substrate 10 respectively contain metallic powder having different average particle diameters so that shrinkage of the conductive paste layers 20, 40 at a time of sintering can be adjusted, and airtightness of the metallized ceramics substrate 200 to be fabricated can be secured.

When a substrate including a plurality of the metallized layers ("metallized layer" corresponds to the conductive layer of the present invention.) is fabricated by using the post-firing method, a problem is caused in airtightness. The assumption of the inventors about the cause of this problem is described as below.

As described above, in the post-firing method, the conductive paste layer is directly formed on the sintered ceramics substrate to be fired; shrinkage of the conductive paste layer in the crosswise direction is inhibited by the sintered ceramics substrate. As a result, the accuracy and fineness of wiring pattern to be formed can be further enhanced.

By the post-firing method, when a plurality of the metallized layers are formed on the sintered ceramics substrate, furthermore ceramics paste layer for insulation is formed on the above conductive paste layer, and another conductive paste layer is formed thereon. In this case, the sintered ceramics substrate can inhibit shrinkage, in the crosswise direction, of the first conductive paste layer formed thereon; however, it seems difficult for the sintered ceramics substrate to influence up to the second conductive paste layer formed on the ceramics paste layer over the first conductive paste layer through these two layers. That is, the further the distance from sintered ceramics substrate is, the less effect to inhibit the shrinkage in the crosswise direction becomes; shrinkage of the paste layer in the crosswise direction seems to be caused. Consequently, cracks attributed to the difference of shrinkage ratio in the crosswise direction are produced in any one of paste layers, thereby airtightness of the metallized ceramics substrate to be fabricated is seemingly damaged.

As metallic powder constituting the conductive paste, one having larger diameter may possibly inhibit shrinkage of the conductive paste layer at a time of firing. Nevertheless, if this method is simply adopted, surface roughness of the obtained conductive layer becomes rough, therefore the conductive layer becomes inadequate to be used for an electrode for mounting semiconductor devices thereon.

In the invention, in order to make the surface roughness of the obtained conductive paste layer preferable to be used as an electrode and also to inhibit deterioration of airtightness seemingly attributed to the difference of shrinkage ratio between the conductive paste layers, smaller particle diameter of metallic powder constituting the first conductive paste layer 20 is used; thereby, surface roughness of the obtained first conductive layer 22 is reduced and this makes it preferable as an electrode. Meanwhile, larger particle diameter of metallic powder constituting the second conductive paste layer 40 is used; thereby, it is possible to inhibit shrinkage at a time of firing and emerging difference of shrinkage ratio between conductive paste layers. As a result, airtightness of the obtained metallized ceramics substrate 200 is enhanced.

Average particle diameter of the metallic powder contained in the first conductive paste may preferably be 0.1 μm or more and less than 3 μm, it is more preferably 0.5 μm or more and less than 2.5 μm. The first conductive layer 22 obtained by firing the first conductive paste layer 20 containing metallic powder having such an average particle diameter is the one in which surface roughness is less than 1 μm, and which is favorable for mounting semiconductor device 60 thereon. In the invention, it should be noted that the average particle diameter of metallic powder is the value determined in accordance with Air-Permeability Method using "Sub Sieve Sizer" manufactured by Fisher Scientific Company.

As an organic binder contained in the first conductive paste, any kind of commonly known organic binders can be used without limitation. The examples include: acrylic resin such as polyacrylic ester and polymethacrylic ester; cellulose resin such as methylcellulose, hydroxymethylcellulose, nitrocellulose, and cellulose-acetate-butyrate; vinyl-containing resin such as polyvinyl butyral, polyvinyl alcohol, and polyvinyl chloride; hydrocarbon resin such as polyolefin; and oxygen-containing resin such as polyethylene oxide. These may be used alone or in combination with two or more thereof.

As an organic solvent contained in the first conductive paste, any kind of commonly known organic solvents can be used without limitation. For instance, toluene, ethyl acetate, terpineol, butyl carbitol acetate, and texanol may be used; a solvent which can easily resolve the above organic binders may be more preferably selected. For the ceramics paste used for forming the above base ceramics paste layer, the ceramics past used for forming the below-described ceramics paste layer 30 and the first conductive paste, it is better to select a same type of organic binder and organic solvent to attain favorable interlayer blending between the organic binder and organic solvent.

As a dispersant contained in the first conductive paste, any kind of commonly known dispersants can be used without limitation. For example, phosphate type and polycarboxylate type dispersant may be used.

As a plasticizer contained in the first conductive paste, any kind of commonly known plasticizers can be used without limitation. For example, dioctyl phthalate, dibutyl phthalate, diisononyl phthalate, diisodecyl phthalate, and dioctyl adipate may be used.

To the first conductive paste, ceramics powder is preferably added as an inorganic component other than metallic powder. When the same kind of the ceramics powder as the one used for the ceramics paste to form the above base ceramics paste layer and the same kind of the ceramics powder as the one used for the ceramics paste to form the below-described ceramics paste layer 30, and sintering aides to sinter the ceramics powder are added to the first conductive paste, post-sintering adhesiveness between the first conductive layer 22 and the sintered ceramics substrate 10, and between the first conductive layer 22 and the sintered ceramics layer 32 can be improved. As sintering aides, depending on the type of ceramics powder, any kind of normally-used sintering aides can be used without limitation; for instance, if the ceramics is aluminum nitride, rare-earth oxide such as yttrium oxide or alkaline earth metal oxide such as calcium oxide may be used.

Composition of the first conductive paste does not make any difference from that of conventional conductive pastes; usually, to 100 parts by mass of metallic powder, a total of organic component such as organic binder, organic solvent, dispersant, and plasticizer is 5 to 80 parts by mass; meanwhile, a total of inorganic component such as ceramics powder and sintering aides is 0 to 80 parts by mass. Preparation of the paste can be carried out by adequately kneading each component using commonly known kneader like triple-roll mill and planetary mixer.

In the fabrication method of the present invention, the first conductive paste thus prepared is applied on one particular area of the sintered ceramics substrate 10 which may have a base ceramics paste layer. At this stage, shape and size of the area to which the first conductive paste is applied is not specifically limited to as long as ceramics paste layer 30 having a predetermined pattern can be formed thereon and a mounting portion 50 for mounting semiconductor device can be secured. Moreover, when the sintered ceramics substrate 10 has via holes (in other words, through-holes filled with conductive material or conductive paste) and the via holes and the first conductive layer 22 formed therewith are electrically connected each other, the first conductive paste may be applied on the exposed surface of the conductive material or conductive paste. If sintered ceramics substrate 10 has a base ceramics paste layer, it is preferable to dry the base ceramics paste layer before applying the first conductive paste to it.

FIGS. 2(a) to 2(f) are explanatory diagrams illustrating embodiments of the fabrication method of the invention. FIGS. 2(a), 2(c), and 2(e) are respectively plan views showing one or more layers are laminated on the sintered ceramics substrate 10; FIG. 2(b) is a side cross sectional view including A-A' line, FIG. 2(d) is a side cross sectional view including B-B' line, and FIG. 2(f) is a side cross sectional view including C-C' line.

In the embodiment shown in FIGS. 2(a) and 2(b), a set of the first conductive paste layers 20a, 20b, respectively corresponding to the cathode and anode, is formed. In addition, since the first conductive paste layer 20b works as an electrode on which a semiconductor device is mounted, it is widely formed in the crosswise direction. In FIG. 2(a), position of the semiconductor device mounting portion is marked with a dotted line together with a numeral 50.

Application of the first conductive paste may be carried out by any kinds of commonly known method such as screen printing, calendar printing, and pad printing. Thickness of the first conductive paste layer 20 to be formed is not specifically limited to. So as to secure low-resistance and airtightness, pre-firing and post-drying thickness is preferably 1 μm or more, more preferably 5 μm or more in view of possibility to lower the resistance; meanwhile, it is 30 μm or less, more preferably 15 μm or less in view of possibility to secure the airtightness. This is because densification of conductive paste becomes difficult if thickness of the paste becomes thicker.

If certain thickness is required, it is possible to use a method like over-coating by printing. In such a case, it is also possible to change the composition of conductive paste to be coated on the ceramics substrate and of paste to be coated on the conductive paste. For example, as a conductive paste for forming a lower layer, a paste of which content of ceramics powder and sintering aides is higher may be used; on the other hand, as a conductive paste for forming an upper layer, a paste of which content of ceramics powder and sintering aides is lower or which contains no ceramics powder and sintering aides may be used. Consequently, it is possible to make concentration gradient of ceramics component to the eventually formed first conductive layer 22. Alternatively, these concentration gradients may be partly made. For instance, if concentration of the ceramics component of a portion where the ceramics sintered ceramics substrate 10 and the ceramics paste layer 30 are contacted with each other is raised, and concentration of ceramics component of only a surface of a portion where is not covered with the ceramics paste layer 30 is made to zero, when a portion where is not covered by the sintered ceramics layer 32 of the eventually formed first conductive layer 22 is plated, it is capable to provide favorable plating.

In the fabrication method of the invention, it is preferable to dry the formed first conductive paste layer 20 before forming the ceramics paste layer 30. By evaporating and removing the solvent being contained in the first conductive paste layer 20, the solvent contained in the ceramics paste for coating on the first conductive paste layer 20 can be easily absorbed; thereby it is possible to enhance an effect inhibiting dripping and bleed of the ceramics paste layer 30. The drying process can be suitably carried out by holding the substrate in the air at a temperature of 40 to 150° C. for 1 to 30 minutes.

(Forming Step of Ceramics Paste Layer 30)

Forming step of the ceramics paste layer 30 of the invention can be carried out by applying a ceramics paste on the above first conductive paste layer 20 and drying the paste as needed.

As a ceramics paste, a commonly known ceramics paste having components (such as ceramics powder, sintering aides, organic binder, organic solvent, dispersant, and plasticizer) may be used without limitation.

As ceramics powder contained in the ceramics paste, any kind of commonly known ceramics powder can be used without limitation. For instance, powder of various ceramics listed in the description of the sintered ceramics substrate 10 may be used. Among them, it is preferable to use the same type of ceramics powder as the one used for the sintered ceramics substrate 10. When the same type of ceramics powder is also contained in the above first conductive paste, it is favorable because it is possible to enhance adhesiveness between the sintered ceramics substrate 10 and the first conductive layer 22, and between the first conductive layer 22 and the sintered ceramics layer 32. Alternatively, although it depends on the combination, by using different type of ceramics for binding adjacent layers each other, it is sometimes possible to obtain sufficient adhesive strength. For example, even if the type of ceramics is different, so long as the type of cation component (metal atom or semimetal atom) to be contained is the same, it is capable to obtain high adhesiveness.

As sintering aides to be contained in the ceramics paste, depending on the type of ceramics powder, any kind of normally-used sintering aides can be used without limitation. For instance, if ceramics powder is aluminum nitride, rare-earth oxide such as yttrium oxide or alkaline earth metal oxide such as calcium oxide may be used.

As an organic binder contained in the ceramics paste, any kind of commonly known ceramics binder can be used without limitation. Examples of the organic binder include: acrylic resin such as polyacrylic ester, poly methacrylic ester; cellulose resin such as methylcellulose, hydroxymethylcellulose, nitrocellulose, and cellulose-acetate-butyrate; vinyl-group-containing resin such as polyvinyl butyral, polyvinyl alcohol, and polyvinyl chloride; hydrocarbon resin like polyolefin; oxygen-containing resin like polyethylene oxide; and so on. These may be used alone or in combination with two or more thereof. Among them, acrylic resin and cellulose resin are easily dissolved with solvent so that these tend to easily absorb solvent contained in the below-described second conductive paste; thereby it is preferable. Consequently, when the second conductive paste is coated on the ceramics paste layer 30, dripping and bleed of the second conductive paste can be inhibited.

As an organic solvent contained in the ceramics paste, any kind of commonly used organic solvent can be used without limitation; e.g. toluene, ethyl acetate, terpineol, butylcarbitol acetate, and texanol may be used.

As a dispersant contained in the ceramics paste, any kind of commonly known dispersants can be used without limitation. For example, phosphate type and polycarboxylate type dispersant may be used.

As a plasticizer contained in the ceramics paste, any kind of commonly known plasticizers can be used without limitation. For example, dioctyl phthalate, dibutyl phthalate, diisononyl phthalate, diisodecyl phthalate, and dioctyl adipate may be used.

Mixing ratio of the raw material of the ceramics paste is not specifically limited to; to 100 parts by mass of ceramics powder, 0.1 to 15 parts by mass of sintering aides, 6 to 20 parts by mass of organic binder, and 10 to 60 parts by mass of at least one kind selected from a group consisting of organic solvent, plasticizer, and dispersant, is preferable. Moreover, so as to improve printability and to minimize shrinkage at a time of sintering, to 100 parts by mass of ceramics powder, 1 to 10 parts by mass of sintering aides, 6 to 15 parts by mass of organic binder, and 15 to 50 parts by mass of at least one kind selected from a group consisting of organic solvent, plasticizer, and dispersant, is especially preferable.

Preparation method of the ceramics paste is not particularly limited to as long as each component can be mixed and a paste of homogeneous component can be obtained. Examples thereof include commonly known kneading method using triple-roll mill and planetary mixer may be adopted.

In the fabrication method of the invention, ceramics paste thus prepared is applied to a predetermined area in the surface of the first conductive paste layer 20. At this stage, shape and size of the area to which the first conductive paste is applied is not specifically limited to as long as the second conductive paste layer having a predetermined pattern can be formed thereon. For example, in FIGs. 2(*c*) and 2(*d*), the ceramics paste layer 30 is configured to encircle the semiconductor device mounting portion 50. Further, coating of the ceramics paste may be carried out in the same manner as the method for coating the above first conductive paste.

Figure 2:
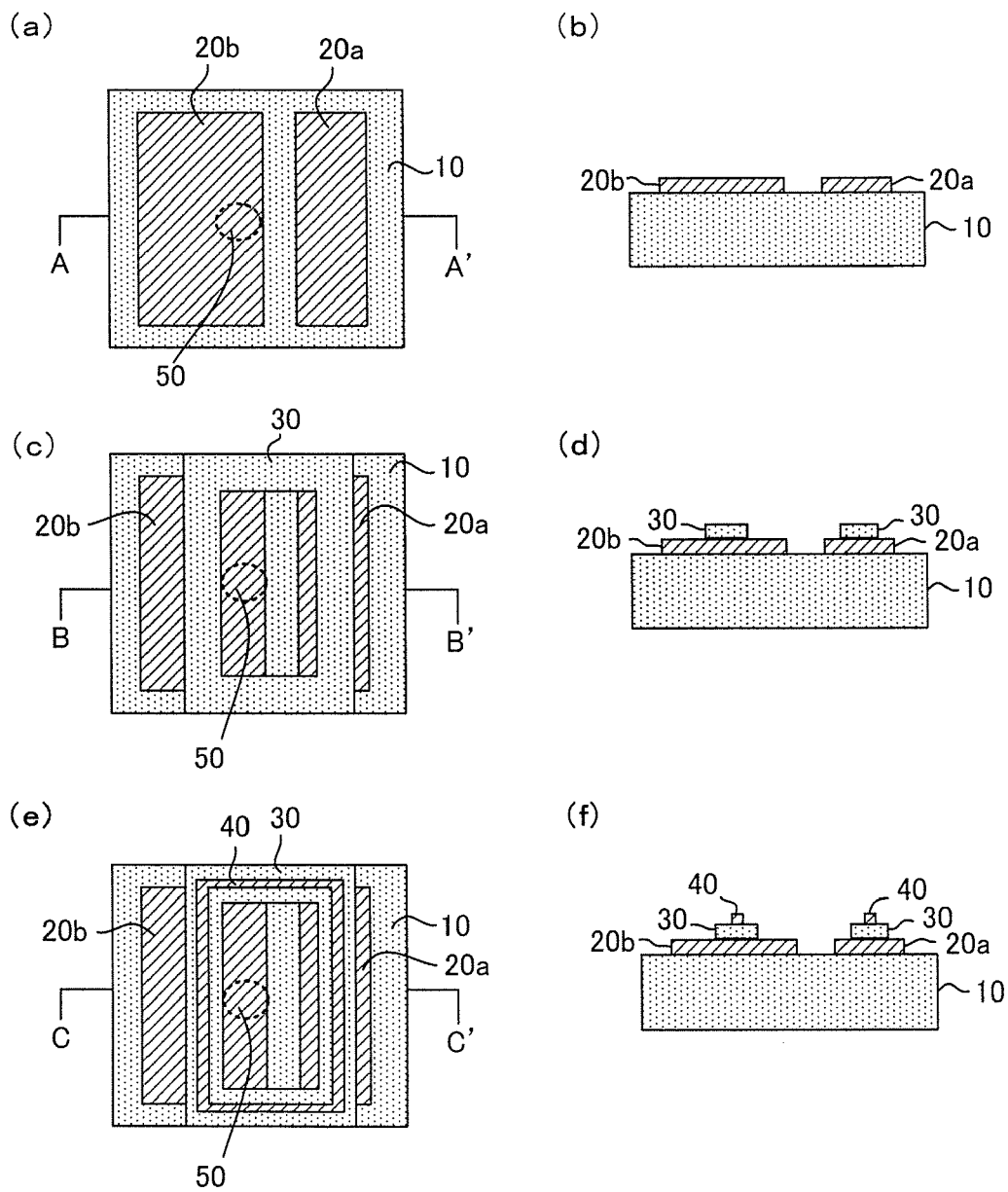
FIGS. 2(a) to 2(f) are explanatory diagrams illustrating steps of the fabrication method of the invention: specifically.

In addition, as for the ceramics paste layer 30, a part thereof may be directly formed on the sintered ceramics substrate 10. Since the ceramics paste layer 30 is a layer formed so as to insulate the first conductive layer 22 and the second conductive layer 42, it should simply exist between the first conductive paste layer 20 and the second conductive paste layer 40. If it meets this condition, the area where the ceramics paste layer 30 is formed is not specifically limited to. In other words, in the fabrication method of the second embodiment of the invention, the phrase "forming the ceramics paste layer on the first conductive paste layer" does not mean to form the ceramics paste layer 30 on the entire surface of the first conductive paste layer 20, but to form the ceramics paste layer 30 in the necessary area so as to insulate between the first conductive layer 22 and the second conductive layer 42. For instance, as shown in FIG. 2(*e*), it includes a condition such that even if a part of ceramics paste layer 30 is directly formed on the sintered ceramics substrate 10, in the rest of the part, ceramics paste layer 30 is formed underneath the entire second conductive paste layer 40, so insulation between the first conductive layer 22 and the second conductive layer 42 can be secured.

Thickness of the ceramics paste layer 30 to be formed is not particularly limited to; in order to secure insulation between the first conductive layer 22 and the second conductive layer 42 to ensure reliability of the device, pre-firing and post-drying thickness is preferably 10 μm or more, more preferably 30 μm or more. If the ceramics paste layer 30 is too thick, certain amount of unnecessary ceramics paste is used, which is not economical; moreover, too thick ceramics paste layer 30 brings a possibility of uneven thickness or post-firing distortion. Therefore, the pre-firing and post-drying thickness is preferably 100 μm or less, more preferably 75 μm or less.

It should be noted that the formed ceramics paste layer 30 is preferably dried before forming the second conductive paste layer 40 thereon. The reason for this is same as that for drying the first conductive paste layer 20. By doing this, it is possible to inhibit dripping and bleed of the second conductive paste layer 40.

(Forming Step of Second Conductive Paste Layer 40)

Forming step of the second conductive paste layer 40 of the present invention is carried out by applying the second conductive paste on the ceramics paste layer 30 and drying the paste as needed.

(Second Conductive Paste Layer 40)

As the second conductive paste, if average particle diameter of the metallic powder to be contained is larger than that of metallic powder contained in the first conductive paste, same type of paste used in the first conductive can be used. Average particle diameter of the metallic powder contained in the second conductive paste is preferably 3 μm or more and 6 μm or less, more preferably 3.5 μm or more and 5 μm or less.

Figure 3:
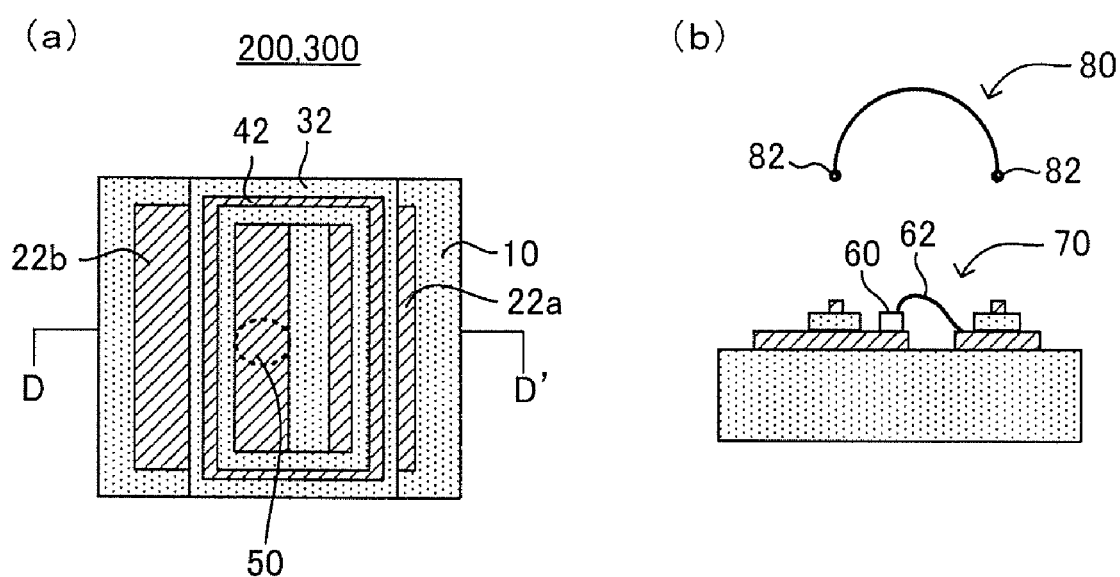
FIG. 3(a) is a plan view of the metallized ceramics substrate 200 (package 300) of the invention.
FIG. 3(b) is a side cross sectional view including D-D' line.

By using metallic powder having such a large particle diameter as metallic powder contained in the second conductive paste, it is possible to inhibit shrinkage of the second conductive paste layer 40 at a time of sintering. Thereby, airtightness of the obtained metallized ceramics substrate 200 can be excellent. Moreover, even if the second conductive layer 42 obtained by firing this second conductive paste layer 40 has a large surface roughness, since second conductive layer 42 (as shown in FIG. 3(b)) is a metallized layer to be used for soldering with the lid member 80, large surface roughness causes no problem.

Adding the same type of ceramics powder (and sintering aides) contained in the ceramics paste layer 30 to the second conductive paste layer 40 and thereby improving adhesiveness between the post-sintered sintered ceramics layer 32 and second conductive layer 42 is the same in the case of the first conductive paste layer. Also, in the same manner as the first conductive paste layer, concentration of ceramics component may be graded.

The second conductive paste is coated on the ceramics paste layer 30. Shape and size of the area to which the second conductive paste is applied is not specifically limited to as long as it is feasible to solder the below-described lid member 80. In the embodiment shown in FIGs. 2(e) and 2(f), the second conductive paste layer 40 is formed on the ceramics paste layer 30 to encircle the semiconductor device mounting portion 50. The lid member 80 is not necessarily soldered, but also welded for some cases. As welding, any kind of commonly known joining method such as seam welding, resistance welding, and laser welding may be used. In this case, it becomes possible by brazing metal materials having low-thermal expansion coefficient such as 42—alloy and kovar on the second conductive layer 42 using brazing filter metal like silver solder.

Application of the second conductive paste can be carried out in the same method as that of the first conductive paste. Also, so as to secure strength endurable against soldering and brazing, pre-firing and post-drying thickness of the second conductive paste layer 40 is preferably 10 μm or more, more preferably 20 μm or more. Moreover, since condensed sintering is difficult, so as to ensure airtightness, pre-firing and post-drying thickness is preferably 60 μm or less, more preferably 50 μm or less. Furthermore, the second conductive paste layer 40 may be dried before the below-described firing step; the drying method in this case is the same as that of the first conductive paste layer 20.

The embodiment as shown in FIG. 2(f) is formed such that the first conductive paste layer 20, the ceramics paste layer 30, and the second conductive paste layer 40 are laminated in a staircase pattern. This embodiment is a preferable one in view of manufacturing method to inhibit the dripping of the coated paste. However, the fabrication method of the invention is not limited to this embodiment, as long as the dripping of the paste can be inhibited, each layer may be formed in the same width.

(Firing Step)

By firing the metallized ceramics substrate precursor 100 having the first conductive paste layer 20, the ceramics paste layer 30, and the second conductive paste layer 40 thus obtained in the above way, a metallized ceramics substrate 200 can be obtained as a product of the present invention. If necessary, degreasing may be done before firing.

Degreasing is carried out by thermal treatment of the metallized ceramics substrate precursor 100 in an atmosphere of gas selected from a group consisting of: oxidized gas such as oxygen and air, reducing gas such as hydrogen, inert gas such as argon and nitrogen, carbon dioxide, and mixed gas thereof, or humidified gas mixed with steam. Condition of the thermal treatment is adequately determined within the range of temperature: 250 to 1200° C., holding time: 1 to 1000 minutes depending on the type and content of the organic component contained in the metallized ceramics substrate precursor 100.

Firing carried out after the degreasing treatment adequately adopts normally-adopted condition depending on a kind of used ceramics paste (specifically, kind of ceramics powder for the paste). For example, when ceramics powder contained in the ceramics paste layer 30 essentially consists of aluminum nitride series ceramics, firing may be carried out at a temperature of 1600 to 2000° C., preferably 1700 to 1850° C. for 1 to 20 hours, preferably 2 to 10 hours under an atmosphere of nonoxidizing gas such as nitrogen gas at atmospheric pressure.

Thickness of each sintered body layer 22, 32, 42 is normally 20 to 80% of that of each paste layer 20, 30, 40. So, in order to obtain a sintered body layer having desirable thickness, thickness of the paste layers should be adequately adjusted.

<Metallized Ceramics Substrate 200, Package 300>

By the fabrication method of the above-described second embodiment of the present invention, it is capable to obtain a metallized ceramics substrate 200 of the invention which is a substrate in which the first conductive layer 22, the sintered ceramics layer 32, and the second conductive layer 42 are laminated in this order on the sintered ceramics substrate 10, wherein surface roughness of the first conductive layer 22 is less than 1 μm, preferably 0.85 μm or less, and surface roughness of the second conductive layer 42 is 1 μm or more, preferably 1.05 μm or more. "Surface roughness" in this circumstance means "center-line mean deviation of the profile (Ra)" defined in JIS B0601. Moreover, for instance, if metallic powder, of which particle diameter is less than 3 μm, contained in the first conductive paste is used, it is possible to effectively set the surface roughness of the first conductive layer 22 to be less than 1 μm, preferably 0.85 μm or less. Further, if metallic powder, of which particle diameter is 3.0 μm or more, contained in the second conductive paste is used, surface roughness of the second conductive layer 42 can be effectively set to be 1 μm or more, preferably 1.05 μm or more.

FIG. 3(a) is a plan view of the metallized ceramics substrate 200 (package 300), and FIG. 3(b) is a side cross sectional view including D-D' line. In the metallized ceramics substrate 200 of the invention, the first conductive layer 22 is used as an electrode for mounting the semiconductor device 60. As shown in the drawings, a set of the first conductive layers 22a, 22b to function as a cathode and an anode is preferably formed. Also, the sintered ceramics layer 32 and the second conductive layer 42 are preferably formed in a frame-like shape to encircle the semiconductor device mounting portion 50 (hereinafter, this may be referred to as "frame-like layer".). In this way, when the semiconductor device mounting portion 50 is encircled by the frame-like layer to form a concave portion 70 for mounting the semiconductor device 60, positioning of elements and components to be mounted on the substrate can become easy; in addition, by raising the frame-like layer higher than the bight of the components to be mounted, it is possible to protect the components.

FIG. 3(a) shows an example of the substrate 200 and the package 300 wherein only one semiconductor device mounting portion 50 is provided in the center portion of the substrate. However, positioning of the semiconductor device mounting portion 50 is not specifically limited to as long as it is made within the area encircled by the frame-like layer and on the first conductive layer 22b. As it were, "center portion of the substrate" does not strictly mean the very center portion, but it is within the area encircled by the frame-like layer and on the first conductive layer 22. In the center portion of the substrate, a plurality of semiconductor device mounting portions 50 may be formed.

When an electronic component is manufactured by using the package of the present invention, as shown in FIG. 3(b), the semiconductor device 60 is mounted on the first conductive layer 22b, the semiconductor device 60 and the first conductive layer 22a are connected to each other by wire bonding 62, and top portion of the semiconductor device 60 and the first conductive layer 22a are sealed by a lid member 80 such as lens to complete the product. In the lid member 80, for example, a metal part 82 is formed at both ends thereof for soldering (or brazing); when the metal part 82 and the second conductive layer 42 are connected by soldering, inside of the electronic component is completely shut off from outside of the component.

Prior to the mounting of semiconductor device 60 and soldering of metal part 82, plating with e.g., Ni, Cu, Ag, Au, Pt, and Rh is preferably given to the exposed surface of the first conductive layers 22a and 22b, and exposed surface of the second conductive layer 42.

EXAMPLES

Hereinafter, the present invention will be described by way of the following examples. However, it is not limited to by these examples.

Example 1

First of all, a plane substrate comprising an aluminum nitride sintered ceramics substrate obtained by sintering aluminum nitride powder of which average particle diameter is 1.5 μm with addition of yttrium oxide as sintering aides was prepared, wherein size of the aluminum nitride sintered ceramics substrate is 5 centimeters square by 0.6 mm thick. Then, 100 parts by mass of tungsten of which average particle diameter is 0.8 μm, 4 parts by mass of aluminum nitride powder of which average particle diameter is 1.5 μm, 0.2 parts by mass of yttrium oxide, 2 parts by mass of ethylcellulose, 13 parts by mass of terpineol, and 1 part by mass of dispersant are kneaded so as to make a conductive paste of which viscosity at 25° C. is adjusted to be 110 Pa·s. Later, by using this conductive paste, a pattern shown in FIGS. 2(a) and 2(b) was formed in a five-by-five matrix (total 25 pieces) on the surface of the plane substrate by screen printing, and drying was carried out at 100° C. for 5 minutes. Thickness of the post-drying film was 10 μm.

Next, 100 parts by mass of aluminum nitride powder of which average particle diameter is 1.5 μm, 5 parts by mass of yttrium oxide powder of which average particle diameter is 0.5 μm, 5 parts by mass of ethylcellulose, and 29 parts by mass of terpineol were kneaded so as to make an aluminum nitride paste of which viscosity at 25° C. is adjusted to be 40 Pa·s. The paste was screen-printed and formed an aluminum nitride paste layer as shown in FIGS. 2(c) and 2(d). Thickness of the post-drying film was 30 μm.

Thereafter, 100 parts by mass of tungsten of which average particle diameter is 4.2 μm, 16 parts by mass of aluminum nitride powder of which average particle diameter is 1.5 μm, 1 part by mass of yttrium oxide, 4 parts by mass of ethylcellulose, 21 parts by mass of terpineol, and 1 part by mass of dispersant were kneaded so as to make a conductive paste of which viscosity at 25° C. is adjusted to be 100 Pa·s. The paste was printed on the aluminum nitride paste layer by screen printing and formed a conductive paste layer as shown in FIGs. 2(e) and 2(f). Thickness of the post-drying film was 15 μm.

A substrate thus obtained by the above method was fired under nitrogen gas at 1800° C. for 4 hours; then, a metallized substrate were obtained. To this obtained substrate, electroless Ni—B plating was given, and a sheet of kovar (0.15 mm thick) was brazed with silver solder. And, electroless Ni—P plating and electroless Au plating were given at a conductive part. Further, the obtained substrate was cut into twenty-five of 9 centimeters square test pieces.

After this, the test piece was heated in the atmosphere at 320° C. for 10 minutes, and inspected the airtightness in accordance with MIL-STD-883C METHOD 1014.7 "measuring method of unsealed package" by using He leak detector; the result about all the test pieces were $4.9 \times 10^{-9}$ Pa·m³/s or less. Thus, even when a kovar-made lid having Au coating was soldered to a package having satisfactory airtightness in a condition of unsealed state with Au—Sn solder (heating at 320° C. for 10 minutes), airtightness was $4.9 \times 10^{-9}$ Pa·m³/s or less. Therefore, hereinafter, all the airtightness tests were carried out in a condition where the package was unsealed. Surface roughness of the first conductive layer was 0.6 μm in Ra; meanwhile, surface roughness of the second conductive layer was 1.2 μm in the same.

Example 2

Except for changing the post-printing and post-drying film thickness of the second conductive layer to be 30 μm, test pieces of Example 2 were made in the same manner as Example 1. When the airtightness of these were inspected, all of the pieces showed $4.9 \times 10^{-9}$ Pa·m³/s or less. Surface roughness of the first conductive layer was 0.6 μm in Ra; meanwhile, surface roughness of the second conductive layer was 1.2 μm in the same.

Example 3

Except for changing the particle diameter of tungsten of the first conductive layer to be 2.6 μm, test pieces of Example 3 were made in the same manner as Example 1. When the airtightness of these were inspected, all of the pieces showed $4.9 \times 10^{-9}$ Pa·m³/s or less. Surface roughness of the first conductive layer was 0.8 μm in Ra; meanwhile, surface roughness of the second conductive layer was 1.2 μm in the same.

Example 4

Except for making the second conductive layer of pieces double-layered structure; as the lower layer, kneading 100 parts by mass of tungsten of which average particle diameter is 4.1 μm, 16 parts by mass of aluminum nitride powder of which average particle diameter is 1.5 μm, 1 part by mass of yttrium oxide, 4 parts by mass of ethylcellulose, 21 parts by mass of terpineol, and 1 part by mass of dispersant, and printing the conductive paste adjusted to make the viscosity at 25° C. become 100 Pa·s; and as the surface layer, kneading 100 parts by mass of tungsten of which average particle diameter is 4.1 μm, 2 parts by mass of ethylcellulose, 11 parts by mass of terpineol, and 1 part by mass of dispersant, and printing the conductive paste adjusted to make the viscosity at 25° C. become 80 Pa·s; test pieces of Example 4 were made in the same manner as Example 1. When the airtightness of these were inspected, all of the pieces showed $4.9 \times 10^{-9}$ Pa·m$^3$/s or less. Surface roughness of the first conductive layer was 0.6 μm in Ra; meanwhile, surface roughness of the second conductive layer was 1.1 μm in the same.

Example 5

Kneading 100 parts by mass of aluminum nitride powder of which average particle diameter is 1.5 μm, 5 parts by mass of yttrium oxide powder of which average particle diameter is 0.5 μm, 5 parts by mass of ethylcellulose, and 29 parts by mass of terpineol to make an aluminum nitride paste of which viscosity at 25° C. was adjusted to be 40 Pa·s, and the paste was screen-printed to the surface of plane substrate. Dried thickness of this paste layer was 10 μm. Otherwise, test pieces of Example 5 were made in the same manner as Example 1. When the airtightness of these were inspected, all of the pieces showed $4.9 \times 10^{-9}$ Pa·m$^3$/s or less. Surface roughness of the first conductive layer was 0.6 μm in Ra; meanwhile, surface roughness of the second conductive layer was 1.2 μm in the same.

Example 6

Except for changing the dried thickness of the ceramics paste layer formed on the first conductive paste layer to be 80 μm, test pieces of Example 6 were made in the same manner as Example 5. When the airtightness of these were inspected, all of the pieces showed $4.9 \times 10^{-9}$ Pa·m$^3$/s or less. Surface roughness of the first conductive layer was 0.6 μm in Ra; meanwhile, surface roughness of the second conductive layer was 1.2 μm in the same.

Comparative Example 1

Except for changing the particle diameter of tungsten for the second conductive layer to 0.8 μm, metallized substrates were made in the same manner as Example 1 and the same evaluations were carried out. When the airtightness of the obtained substrate was inspected, it was $1 \times 10^{-7}$ to $10 \times 10^{-7}$ Pa·m$^3$/s, which was not sufficient. Surface roughness of the first conductive layer was 0.6 μm in Ra; meanwhile, surface roughness of the second conductive layer was 0.6 μm in the same.

Comparative Example 2

Except for changing the particle diameter of tungsten for the first conductive layer and the second conductive layer to be 2.5 μm, metallized substrates were made in the same manner as Example 1 and the same evaluations were carried out. When the airtightness of the obtained substrate was inspected, it was $1 \times 10^{-7}$ to $1 \times 10^{-8}$ Pa·m$^3$/s, which was not sufficient. Surface roughness of the first conductive layer was 0.8 μm in Ra; meanwhile, surface roughness of the second conductive layer was 0.8 μm in the same.

The above has described the present invention associated with the most practical and preferred embodiments thereof. However, the invention is not limited to the embodiments disclosed in the specification. Thus, the invention can be appropriately varied as long as the variation is not contrary to the subject substance and conception of the invention which can be read out from the claims and the whole contents of the specification. It should be understood that fabrication method of the metallized ceramics substrate, a metallized ceramics substrate, and a package with such an alternation are included in the technical scope of the invention.

The invention claimed is:

1. A package for mounting a semiconductor device, the package comprising a metallized ceramics substrate comprising:
   a sintered ceramics substrate;
   a first conductive layer of which surface roughness is 0.85 μm or less comprising tungsten and/or molybdenum and being formed on said sintered ceramics substrate;
   a sintered ceramics layer formed on said first conductive layer; and
   a second conductive layer of which surface roughness is 1.05 μm or more comprising tungsten and/or molybdenum and being formed on said sintered ceramics layer,
   wherein a semiconductor device mounting portion is provided on said first conductive layer;
   said sintered ceramics layer and said second conductive layer are configured to surround said semiconductor device mounting portion so as to form a cavity portion for housing a semiconductor device;
   the semiconductor device which should be mounted is sealed by connecting a lid member having a metal part to the second conductive layer through the metal part; and
   the package has airtightness of $4.9 \times 10^{-9}$ Pa·m$^3$/s or less when the semiconductor device is sealed.

2. The package according to claim 1, wherein said metallized ceramics substrate is a substrate formed by firing a metallized ceramics substrate precursor comprising:
   a sintered ceramics substrate;
   a first conductive paste layer formed on the surface of the sintered ceramics substrate;
   a ceramic paste layer formed on the first conductive paste layer; and
   a second conductive paste layer formed on the ceramic paste layer.

3. The package according to claim 2, wherein
   said first conductive paste layer consists of a first conductive paste containing tungsten powder and/or molybdenum powder having an average particle diameter of 0.5 μm or more and less than 2.5 μm; and
   said second conductive paste layer consists of a second conductive paste containing tungsten and/or molybdenum powder having an average particle diameter of 3.5 μm or more and 5 μm or less.

4. The package according to claim 1, wherein a ceramics constituting said sintered ceramics substrate and said sintered ceramics layer is aluminum nitride.

5. The package according to claim 1, wherein said metallized ceramics substrate is a substrate formed by firing a metallized ceramics substrate precursor comprising:
   a sintered ceramics substrate;

a base ceramics paste layer formed on the surface of the sintered ceramics substrate;

a first conductive paste layer formed on the base ceramics paste layer;

a ceramic paste layer formed on the first conductive paste layer; and a second conductive paste layer formed on the ceramic paste layer.

6. An electronic component comprising:

a metallized ceramics substrate comprising: a sintered ceramics substrate; a first conductive layer of which surface roughness is 0.85 μm or less comprising tungsten and/or molybdenum and being formed on said sintered ceramics substrate;

a sintered ceramics layer formed on said first conductive layer; and a second conductive layer of which surface roughness is 1.05 μm or more comprising tungsten and/or molybdenum and being formed on said sintered ceramics layer;

a semiconductor device mounted on a semiconductor device mounting portion provided on said first conductive layer; and a lid member having a metal part, wherein said sintered ceramics layer and said second conductive layer are configured to surround said semiconductor device mounting portion so as to form a cavity portion for housing the semiconductor device;

the semiconductor device is sealed by connecting the lid member to the second conductive layer through the metal part; and the electronic component has airtightness of $4.9 \times 10^{-9}$ Pa·m$^3$/s or less.

* * * * *